US007675985B1

(12) United States Patent
Watson

(10) Patent No.: US 7,675,985 B1
(45) Date of Patent: Mar. 9, 2010

(54) DIGITAL CHANNELIZER UNIT FOR PROCESSING MULTIPLE DIGITAL INPUT SIGNALS

(75) Inventor: Bradford S. Watson, Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 700 days.

(21) Appl. No.: 11/599,720

(22) Filed: Nov. 14, 2006

Related U.S. Application Data

(60) Provisional application No. 60/735,864, filed on Nov. 14, 2005.

(51) Int. Cl.
*H04K 1/10* (2006.01)
(52) U.S. Cl. .................... 375/260; 370/464; 370/480; 370/484; 370/485
(58) Field of Classification Search ................. 375/260; 370/464, 480, 484, 485
See application file for complete search history.

(56) References Cited

U.S. PATENT DOCUMENTS

| | | | | |
|---|---|---|---|---|
| 5,260,968 | A | * | 11/1993 | Gardner et al. .............. 375/347 |
| 5,732,189 | A | * | 3/1998 | Johnston et al. ............. 704/230 |
| 5,790,529 | A | * | 8/1998 | Haber ........................ 370/536 |
| 5,999,573 | A | * | 12/1999 | Zangi ......................... 375/316 |
| 6,356,569 | B1 | * | 3/2002 | Sonalkar et al. ............. 370/545 |
| 6,366,776 | B1 | * | 4/2002 | Wright et al. ................ 455/427 |
| 6,393,066 | B1 | * | 5/2002 | Moretti et al. ............... 375/295 |
| 6,898,235 | B1 | * | 5/2005 | Carlin et al. ................. 375/219 |
| 6,947,509 | B1 | * | 9/2005 | Wong ......................... 375/350 |
| 6,954,614 | B2 | * | 10/2005 | Jespersen ................... 455/13.3 |
| 7,372,907 | B2 | * | 5/2008 | Munoz et al. ............... 375/260 |
| 2003/0076899 | A1 | * | 4/2003 | Kumar et al. ............... 375/316 |
| 2005/0276335 | A1 | * | 12/2005 | Kumar ........................ 375/260 |

OTHER PUBLICATIONS

Wiemann, "The ACeS digital channelizer-the next generation in regional digital satellite telephone communications", Proceedings DASC The 19th Digital Avionics Systems Conferences, 2000, vol. 2, Oct. 7-13, 2000 pp. 8B3/1-8B3/6 vol. 2.*
Fung, "A multistage filterbank-based channelizer and its multiplier-less realization", ISCAS 2002, IEEE International Symposium on Circuits and Systems, 2002, vol. 3, May 26-29, 2002 pp. III-429-III-432 vol. 3.*

* cited by examiner

*Primary Examiner*—Juan A Torres
(74) *Attorney, Agent, or Firm*—McDermott Will & Emery LLP

(57) ABSTRACT

A digital channelizer unit is proposed for a satellite digital payload capable of processing multiple digital input signals. The input signals are downsampled and converted to complex baseband signals for processing with the digital channelizer unit. Each complex baseband signal is then channelized into multiple channels. A routing module rearranges the channels, which are then reconstructed as new complex baseband signals. The new complex baseband signals are upsampled to a higher data rate and converted to digital passband signals.

17 Claims, 15 Drawing Sheets

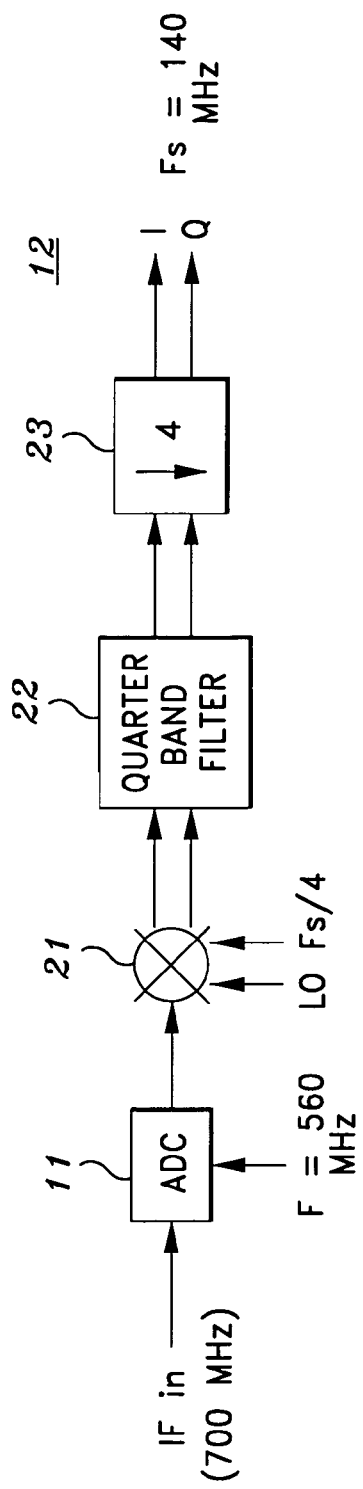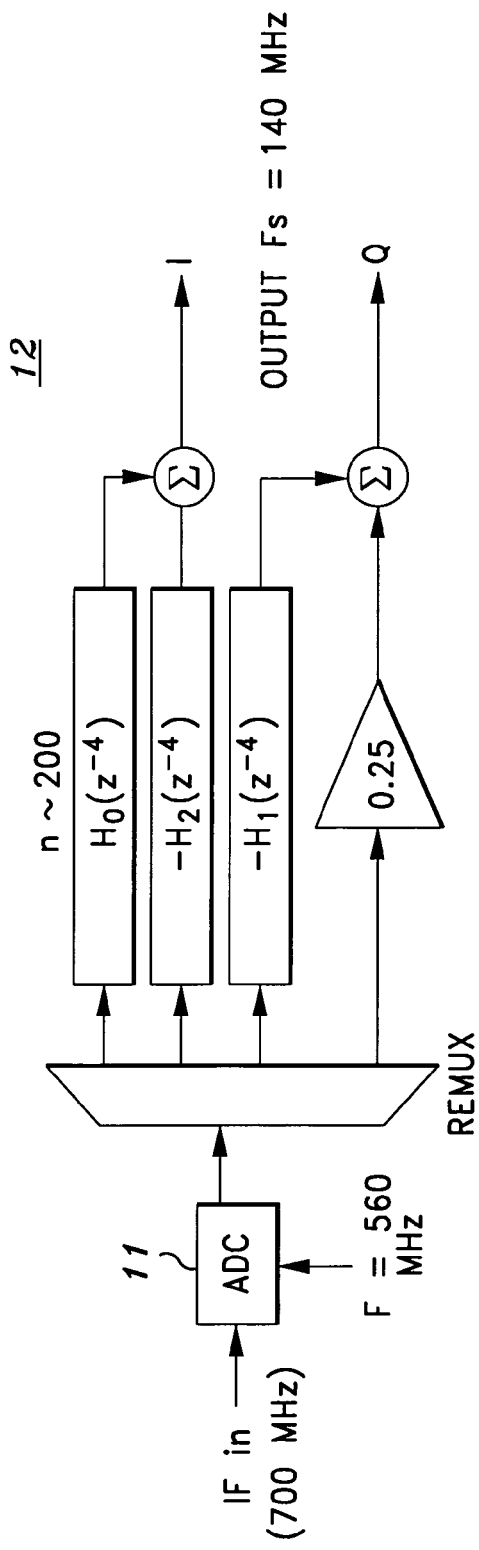

DIGITAL CHANNELIZER UNIT FOR PROCESSING MULTIPLE DIGITAL INPUT SIGNALS

This application claims the benefit of U.S. Provisional Patent Application No. 60/735,864 filed on Nov. 14, 2005, which is hereby incorporated herein by reference.

STATEMENT REGARDING FEDERALLY SPONSORED RESEARCH OR DEVELOPMENT

Not applicable.

FIELD OF THE INVENTION

The invention concerns a satellite digital payload and, more particularly, a digital channelizer unit configured to channelize and route signals within a satellite.

BACKGROUND OF THE INVENTION

Commercial satellites are typically configured to receive signals up-linked from one or more transmission sources and to down-link those signals to one or more receiving stations. Conventional satellite payload configurations are inflexible and do not provide the means for satellite operators to take advantage of technological advances in satellite technology. For example, advances in phased-array antenna technology have improved control over the steering and coverage area of antenna beams. As this technology continues to advance, satellite operators will be able to increase the number of different regions they can service with a single satellite. However, the number of channels available in conventional satellites for sending and receiving data is relatively small and is fixed at the time of assembly and/or launch. Furthermore the size of conventional satellite channels, typically around 36 MHz, is too large to make satellite service in smaller regions and/or for smaller clients cost effective.

Looking forward, satellite operators will require satellite payloads that are flexible enough to meet future market needs. These market needs will include both smaller channel bandwidths and the flexibility to modify the payload configuration after launch to capture new business opportunities. With these capabilities, satellite operators will be able to offer service to a broader range of clients thereby increasing revenue and profits.

Accordingly, a need exists for a configurable satellite payload that offers flexibility in its management of communication channels.

SUMMARY OF THE INVENTION

The invention provides a satellite digital payload configured to process and route multiple channels embedded within multiple input signals. Each input signal is digitized and separated into multiple channels. The channels from all of the input signals are rearranged based on a routing table and assembled into new digital output signals. The digital output signals are then processed and converted back into analog form for transmission. Using this arrangement, multiple channels of data can be received from various signal transmission sources at a satellite and then distributed to various receiving stations based on user preferences. In addition, the use of field programmable gate arrays and careful selection of system parameters allows the digital payload to be modified for use under different bandplans by loading a new configuration file into the system.

According to one embodiment of the invention, a digital channelizer unit is provided that includes multiple preprocessors configured to reduce the sample rate of respective digital input signals and downconvert the digital input signals to complex baseband input signals. Channelizers are configured to divide respective ones of the complex baseband input signals into multiple channels and reduce the sample rates of the channels. A routing module is configured to rearrange the channels according to a routing table. The rearranged channels are then upsampled and combined by reconstructors into complex baseband output signals. Postprocessors then increase the sample rates of the complex baseband output signals and upconvert the signals a digital passband output signals.

According to another embodiment of the invention, a digital channelization method is provided in which digital input signals have their sample rates reduced and are downconverted into complex baseband input signals. The complex baseband input signals are then divided into multiple channels. The sample rates of the channels is reduced and the channels are rearranged based on a routing table. The rearranged channels are then combined into complex baseband output signals, which have the sample rates increased and are converted to digital passband output signals.

The foregoing summary of the invention has been provided so that the nature of the invention can be understood quickly. A more detailed and complete understanding of the preferred embodiments of the invention can be obtained by reference to the following description of the invention together with the associated drawings.

BRIEF DESCRIPTION OF THE DRAWINGS

FIG. 3 is a block diagram depicting functional blocks of a preprocessor according to one embodiment of the invention.

FIG. 4 is a block diagram depicting DSP components of a preprocessor according to one embodiment of the invention.

DETAILED DESCRIPTION OF THE INVENTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

The present invention is directed to a satellite digital payload system configured to process signals transmitted via a satellite. In particular, the invention provides a novel satellite digital payload system that expands the capabilities of satellites beyond the basic "bent pipe" systems used in conventional satellites. As will be discussed in more detail below, the invention provides a system capable of processing bandwidth spread across multiple input signals received by a satellite so as to distribute segments of those input signals among multiple output signals. To achieve this, the system performs mathematical manipulations of data samples of the input signals using hardware implemented fixed point arithmetic operations. For purposes of this description, the satellite system is assumed to have four input ports, each configured to receive an input signal from various transmission sources, and four output ports, each configured to transmit an output signal to various receivers. The transmission sources and receivers include, but are not limited to, ground stations (both stationary and mobile), aircraft, spacecraft, etc. Furthermore, the invention is not intended to be limited to a configuration having four input ports and four output ports. Other configurations having more or less than four input/output ports are also contemplated within the scope of the invention.

Figure 1:
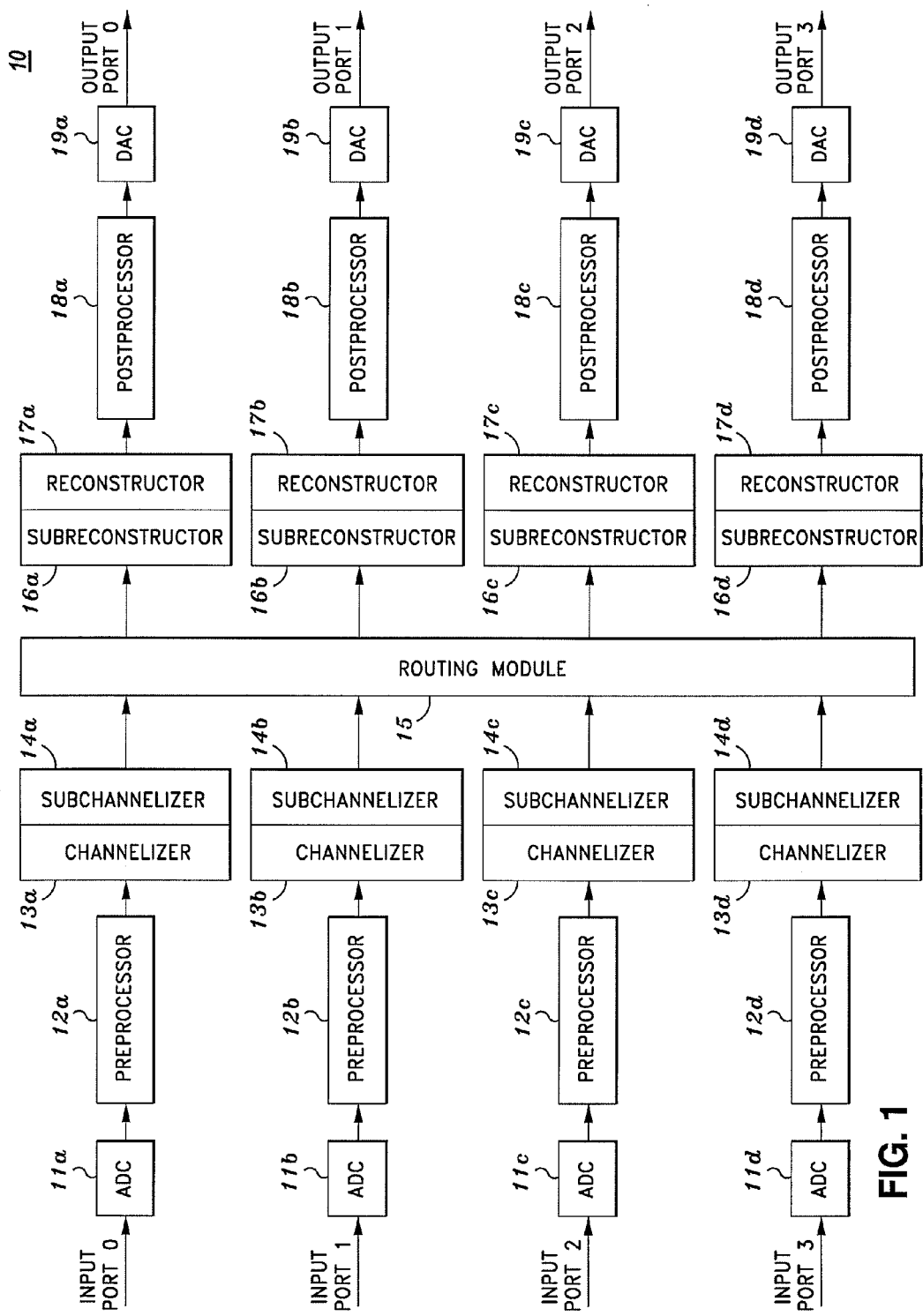
FIG. 1 is a block diagram depicting the components of a digital channelizer unit according to one embodiment of the invention.

FIG. 1 is a block diagram depicting components of a digital channelizer unit ("DCU") 10 according to one embodiment of the invention. DCU 10 is a satellite digital payload configured to process four input signals received at input ports 0 to 3 into four output signals output at output ports 0 to 3. As shown in FIG. 1, DCU 10 includes analog-to-digital converters ("ADC") 11a to 11d, preprocessors 12a to 12d, channelizers 13a to 13d, subchannelizers 14a to 14d, a routing module 15, subreconstructors 16a to 16d, reconstructors 17a to 17d, postprocessors 18a to 18d, and digital-to-analog converters ("DAC") 19a to 19d.

Figure 2:
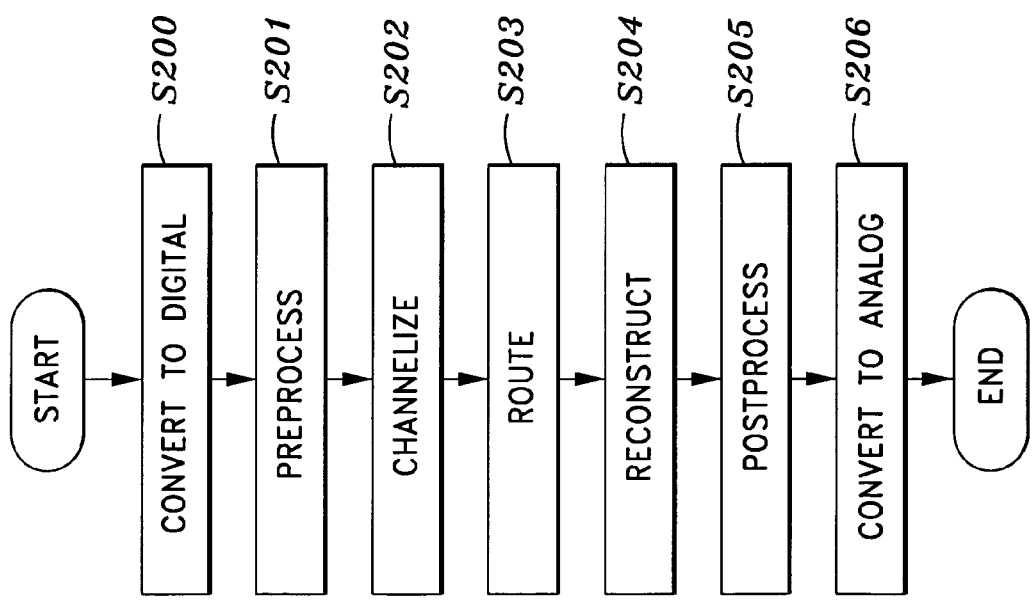
FIG. 2 is a flowchart depicting the processing steps of a digital channelizer algorithm according to one embodiment of the invention.

The processing performed by DCU 10 is summarized in the flowchart depicted in FIG. 2. Briefly, ADCs 11a to 11d convert the input signals received at input ports 0 to 3 into digitized input signals in step S200. In step S201, preprocessors 12a to 12d prepare the digitized input signals for further processing by downsampling the input signals and converting them to complex baseband input signals. In step S202, each of the complex baseband input signals is channelized and subchannelized into multiple subchannels by channelizers 13a to 13d and subchannelizers 14a to 14d. The subchannels are rearranged and routed by routing module 15 in step S203. The rearranged subchannels are then reconstructed into complex baseband output signals in step S204 by subreconstructors 16a to 16d and reconstructors 17a to 17d. In step S205, postprocessors 18a to 18d take the complex baseband output signals and prepare them for transmission by upsampling and converting the signals to passband output signals. Finally, the passband output signals are converted to analog signals by DACs 19a to 19d in step S206 prior to be passed to output ports 0 to 3. Details regarding each of the foregoing steps will be provided in the description below.

For purposes of this description, DCU 10 is configured to process a total frequency bandwidth of 500 MHz divided into four 125 MHz bandwidth signals corresponding to input ports 0 to 3. The 500 MHz frequency bandwidth may or may not be contiguous. DCU 10 is further configured to selectively implement multiple bandplans within the 500 MHz (4×125 MHz) frequency bandwidth. Each bandplan calls for dividing the input frequency bandwidth into multiple subchannels of each bandwidth that are uniformly spaced across the input bandwidth frequency spectrum. For example, the input frequency bandwidth of 4×125 MHz may be divided into 108×4 MHz subchannels (4 MHz bandplan), 52×8 MHz subchannels (8 MHz bandplan) or 12×36 MHz subchannels (36 MHz bandplan; ITU standard). One skilled in the art will recognize that the invention is not limited to these particular bandplans and can be applied to bandplans having other frequency bandwidths.

DCU 10 is designed to be remotely configurable to support a group of bandplans. It is noted, however, that bandplans cannot be mixed within the input signal received at an individual input port and within the output signal output at an individual output port. Furthermore, there must be an equal number of input ports and output ports configured under the same bandplan. For example, all of the input ports and output ports can be configured under a single bandplan, such as the 4 MHz bandplan. Alternatively, two input ports and two output ports can be configured under the 4 MHz bandplan while the remaining two input ports and two output ports are configured under the 8 MHz bandplan. Other combinations are possible in alternative embodiments of the invention in which different bandplans are used and in which different numbers of input ports and output ports are implemented.

To illustrate the operation of DCU 10 according to one embodiment of the invention, the processing of a 125 MHz bandwidth input signal at input port 0 will now be described. One of ordinary skill in the art will understand that similar processing is performed for input signals received at input ports 1, 2 and 3. Furthermore, one of ordinary skill in the art will understand that input signals having bandwidths other than 125 MHz can be processed in alternative embodiments using the concepts and principles of the invention described herein.

As depicted in FIG. 1, ADC 11a receives an input signal via input port 0. ADC 11a performs analog-to-digital conversion on the input signal to digitize the signal for further processing within DCU 10. Specifically, ADC 11a samples the analog input signal received from input port 0 at an input sample rate to create a digitized input signal. The input sample rate is derived from the subchannel center frequency spacing and is selected so as to accommodate all of the possible bandplan configurations (i.e., 4 MHz, 8 MHz and 36 MHz) supported by the particular implementation of the DCU.

Preprocessor 12a receives the digitized input signal from ADC 11a and prepares the digitized input signal for further processing within DCU 10. Specifically, preprocessor 12a downsamples the digitized input signal and converts it to a complex baseband signal. The complex baseband signal is then divided into channels by channelizer 13a and into subchannels by subchannelizer 14a. According to one embodiment of the invention, a decimating polyphase filter is used to implement preprocessor 12a and non-critically sampled polyphase analysis filter banks are used to implement channelizer 13a and subchannelizer 14a. The configurations of each of these components is used to derive the input sample rate used by ADC 11a and the subsequent sample rates used by preprocessor 12a, channelizer 13a and subchannelizer 14a.

The relationships between the input sample rate $Fs_{in}$, the output sample rate $Fs_{out}$ and the band spacing S can be defined with the following equations:

$$S = \frac{Fs_{in}}{R} \quad (1)$$

$$Fs_{out} = \frac{Fs_{in}}{M} \quad (2)$$

$$Fs_{out} = PFs_{in} \quad (3)$$

where R equals the Inverse Discrete Fourier Transform ("IDFT") length within the polyphase filter bank, M equals the decimation rate of the analysis filters and P equals the interpolation rate of the synthesis filters. As mentioned above, channelizer 13a converts the complex baseband input signal into multiple channels, which are subsequently converted into multiple subchannels by subchannelizer 14a. Based on equations (1) to (3), a second set of equations are derived for this cascaded arrangement of filters as shown below:

$$S_1 = \frac{Fs_1}{R_1} \quad (4)$$

$$Fs_2 = \frac{Fs_1}{M_1} = \frac{S_1 R_1}{M_1} \quad (5)$$

$$S_2 = \frac{Fs_2}{R_2} = \frac{S_1 R_1}{M_1 R_2} \quad (6)$$

$$Fs_3 = \frac{Fs_2}{M_2} = \frac{S_1 R_1}{M_1 M_2} \quad (7)$$

A solution set is derived for equations (4) to (7) using the desired band spacing of the bandplans and a set of rules defining the relationship between the IDFT length R and the decimation rate M in each analysis filter. The set of rules includes requiring R and M to be integer values, requiring R>M to implement non-critically sampled polyphase analysis filter banks, and preferably R being a power of two for more efficient hardware implementation of the IDFT.

Using the 4 MHz and 8 MHz bandplans as an example, the desired band spacing is initially set to be the subchannel bandwidth (4 MHz and 8 MHz) plus a 10% guardband (0.4 MHz and 0.8 MHz). Based on the rules for R and M mentioned above, the solution set determines the input sample rate for channelizer 13a to be 140.8 Msamples/sec (Msa/sec). Rounding this value to 140 Msa/sec and plugging this value back into the equations results in band spacing of 4.375 MHz for the 4 MHz bandplan and 8.75 MHz for the 8 MHz bandplan, which still provide sufficient guardbands.

A 140 Msa/sec input sample rate for channelizer 13a provides a starting point to determine a decimation rate for preprocessor 12a and an input sample rate for ADC 11a. Preferably, the input sample rate for ADC 11a is four times the input sample rate for channelizer 13a, making the decimation rate for preprocessor 12a four (4×140 Msa/sec=560 Msa/sec input sample rate). Additionally, the intermediate frequency ("IF") of the input signal digitized by ADC 11a preferably is 1.25 times the input sample rate for ADC 11a (1.25×560 Msa/sec=700 MHz IF). In this manner, sampling the input signal at 560 Msa/sec will result in an aliased image of the input signal appearing between 0 and ½ the sample rate (280 Msa/sec). This aliased image of the signal is centered at 140 MHz, which is ¼ of the ADC 11a input sample rate of 560 Msa/sec. As described below, these characteristics simplify the structure of preprocessor 12a.

FIG. 3 is a conceptual block diagram of preprocessor 12 according to one embodiment of the invention. As shown in FIG. 3, preprocessor 12 includes a complex multiplier 21 for converting the digitized input signal from ADC 11 into a complex baseband signal using a local oscillator ("LO") signal at ¼ the input sample rate, a quarter band filter 22 for alias filtering the complex baseband signal, and a decimator 23 for downsampling the complex baseband signal by a factor of four. The LO output is generated according to the following equation:

$$LO(k) = e^{i\omega t} = e^{\frac{i\omega k}{Fs}} = e^{\frac{i2\pi\left(\frac{Fs}{4}\right)k}{Fs}} = e^{i\frac{\pi k}{2}} \quad (8)$$

which equals 1, −i, −1, i, 1, −i, −1, i, . . . for k=0, 1, 2, 3, . . . . Accordingly, every even sample is multiplied by −1 or 1 and every odd sample is multiplied by −i or i. In addition, multiplication of each signal sample by unity gain results in no phase-noise error being introduced into the signal due to the quantization of the LO.

According to one embodiment of the invention, the decimation operation of the preprocessor is implemented using a 4× decimating polyphase filter with real coefficients. The filter band edges are chosen so that any aliasing that occurs during the decimation process falls out of band. In addition, because there are four legs in this polyphase filter and there are four LO states, as shown above, the decimating polyphase filter can be combined with a quarter band filter and the LO itself to perform aliasing filtering. FIG. 4 is a diagram depicting DSP components of preprocessor 12 according to the foregoing configuration. Using this arrangement, the remux block performs the decimation by 4 and the complex signal components are generated by summing the outputs from the polyphase filter partitions.

Figure 5:
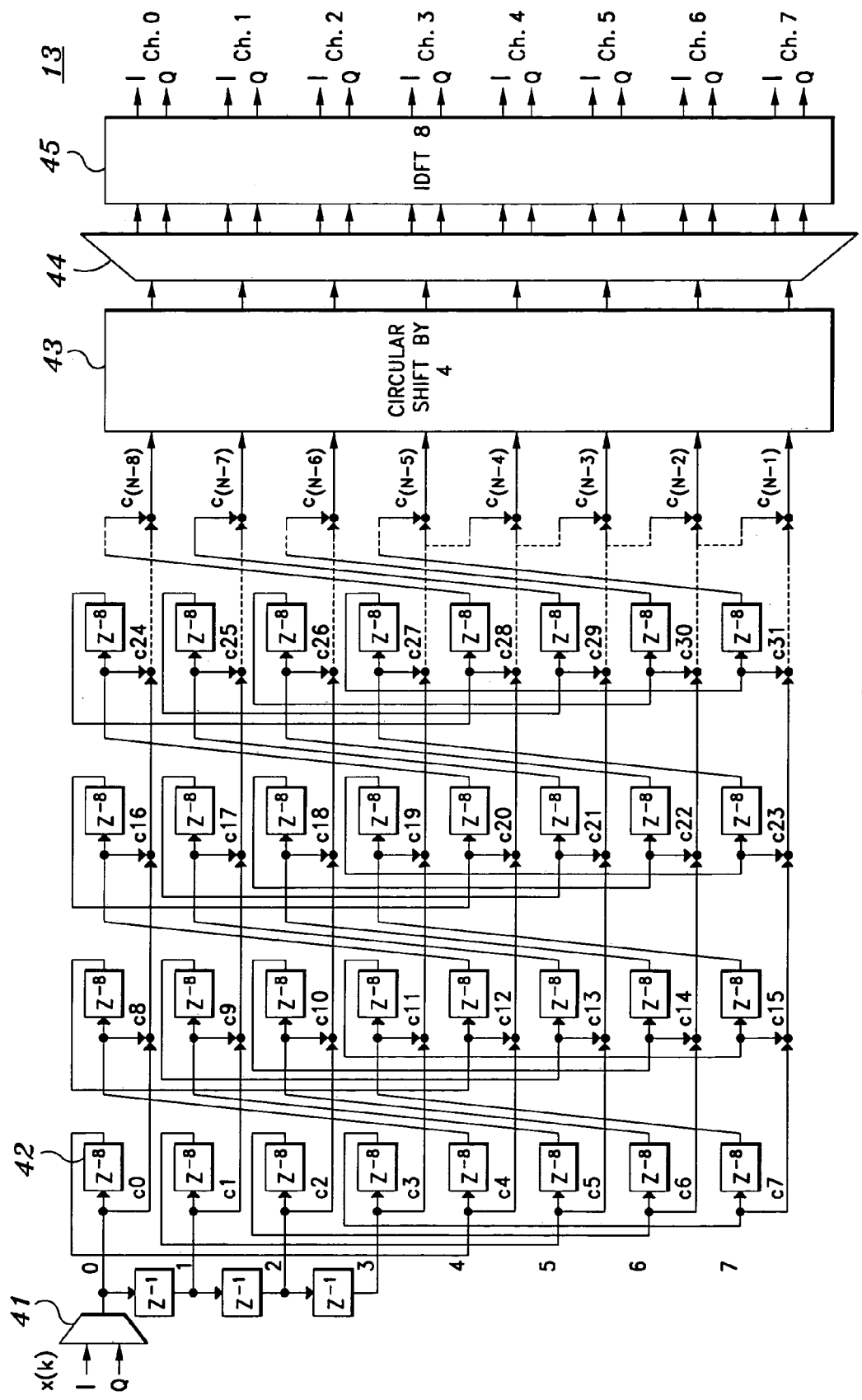
FIG. 5 is a block diagram depicting DSP components of a channelizer according to one embodiment of the invention.

Returning to FIG. 1, channelizer 13a receives the complex baseband signal from preprocessor 12a and divides the signal into multiple channels. As noted above, channelizer 13a is implemented using a non-critically sampled polyphase analysis filter bank. FIG. 5 is a block diagram depicting the DSP components of channelizer 13 configured for the 4 MHz bandplan according to one embodiment of the invention. As shown in FIG. 5, the non-critically sampled polyphase analysis filter bank includes filter coefficients c0 to c(n−1), a multiplexor 41, delay elements 42, a circular shift element 43, a demultiplexor 44 and an IDFT element 45. The specific configuration depicted in FIG. 5 was made based on the solution set determined using equations (4) to (7) described above.

Multiplexor 41 receives the complex baseband signal from preprocessor 12a and multiplexes the real and complex components of the signal. In this manner, a single filter can be used to process both the real components and the complex components of the complex baseband input signal. Using the depicted arrangement of delay elements 42, the input signal is divided into eight channels that have been decimated four times. Accordingly, the decimation rate M is less than the IDFT length R, which indicates an oversampling where the signal is decimated by less than the total possible filter bandwidth. The filter band edges are selected so that any aliasing due to decimation is placed out of band. Examples of channelizers used to implement other bandplans, such as the 8 MHz bandplan, have not been included since one of ordinary skill in the art will understand how to implement such filters using the description contained herein.

Oversampling provides several significant advantages. For example, oversampling reduces the number of filter taps required for channelization because the filter skirt can be relaxed. This reduction in the number of filter taps reduces the amount of circuitry needed to implement the filter banks. Oversampling also provides more flexibility in configuring the filter banks for different bandplans.

An additional benefit of oversampling is the ability to overlap adjacent channel filter passbands. As will be described below, this overlap allows the subchannels ultimately divided by subchannelizer 14a to be equally spaced around baseband. However, this oversampling causes a frequency shift away from baseband in some of the channels. To compensate for this shift and return the frequencies in each shifted channel to baseband, a circular shift element 43 is included in the channelizer configuration.

IDFT element 45 operates on the complex signal of each channel. Accordingly, demultiplexer 44 separates the real and complex components of the input signal and provides a complex signal for each leg of IDFT element 45. IDFT element 45 outputs eight channels evenly distributed around baseband. The channels are complex valued with channels 1 to R/2−1 being the positive frequency channels and R/2+1 to R−1 being the negative frequency channels. Channel 0 straddles 0 frequency and channel R/2 straddles Fs/2. Because there is no useful spectral information centered at Fs/2 and because channel R/2 occurs in the transition band of the preprocessor filter, channel R/2 is discarded. Accordingly, a total of seven channels (channels 0 to 3 and 5 to 7) are retained from channelizer 13 when configured for the 4 MHz band plan (R=8).

Figure 6:
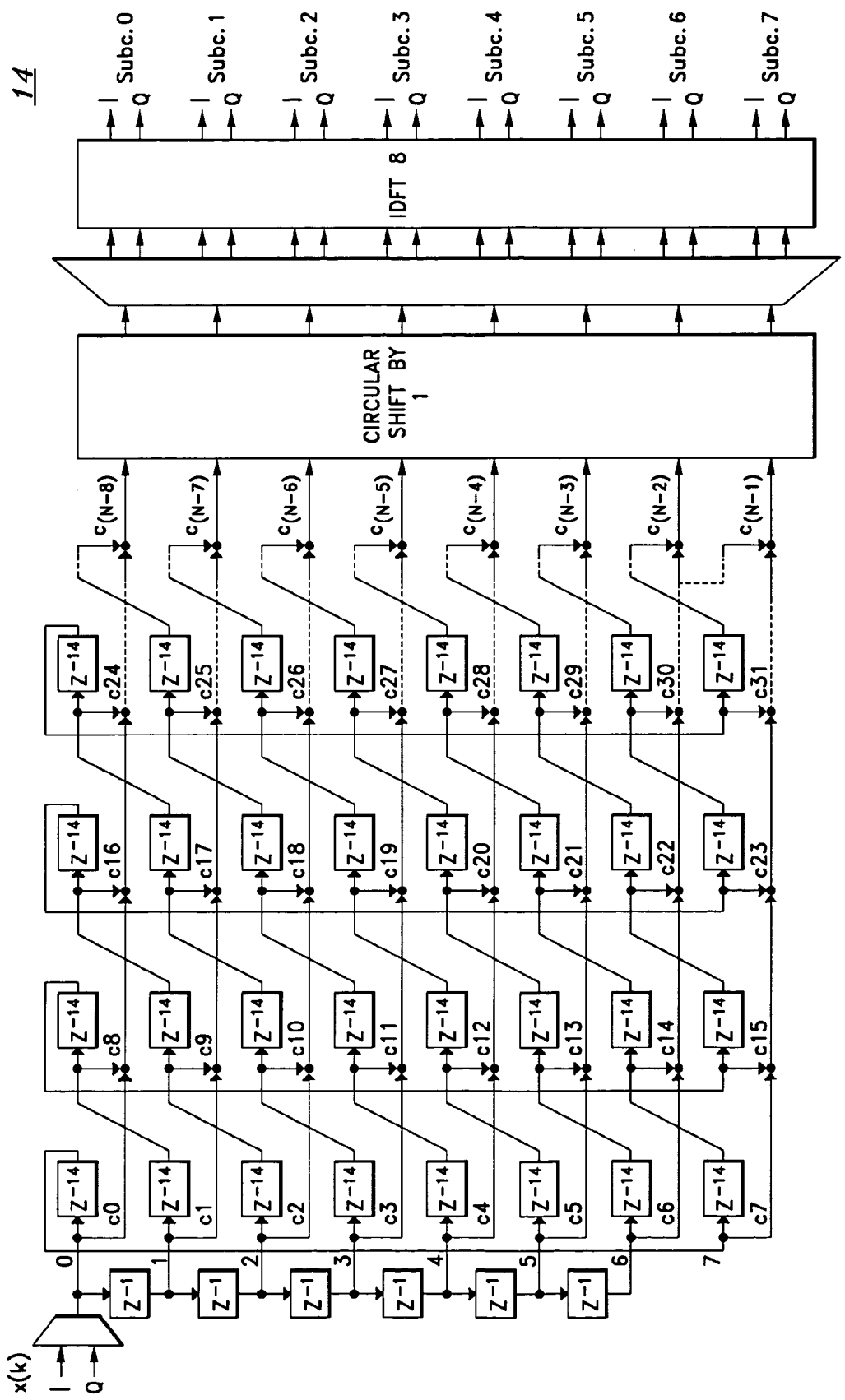
FIG. 6 is a block diagram depicting DSP components of a subchannelizer according to one embodiment of the invention.

Each of the retained channels generated by channelizer 13a is provided to subchannelizer 14a. As with channelizer 13a, subchannelizer 14a is implemented as a non-critically sampled polyphase analysis filter bank configured using the parameters calculated from equations (4) to (7) above. FIG. 6 is a block diagram depicting DSP components of subchannelizer 14 configured for both the 4 MHz bandplan and the 8 MHz bandplan. The operation of subchannelizer 14 is generally the same as channelizer 13 depicted in FIG. 5 and therefore will not be described herein. Diagrams of subchannelizers for other bandplans have not been included herein since one skilled in the art would understand how to implement such filters based on the description herein.

As mentioned above, channelizer 13a and subchannelizer 14a are configured to operate as a cascaded pair of filters. This cascading arrangement is designed to reduce the number of filter taps required to implement the filter banks compared to an arrangement in which a single filter bank for the entire channelization is used. The number of filter taps is roughly proportional to the transition region width of the filter divided by the input sample rate. In order to avoid aliasing, the filter bandwidth should be less than the input sample rate divided by the decimation value M. Accordingly, filters implementing a large decimation value are typically very large. To reduce the filter size, the decimation can be divided between multiple stages. Because the transition widths of the individual filters in the cascade are smaller with respect to the sample rates, the filters themselves require fewer filter taps and therefore less circuitry to implement.

Figure 7:
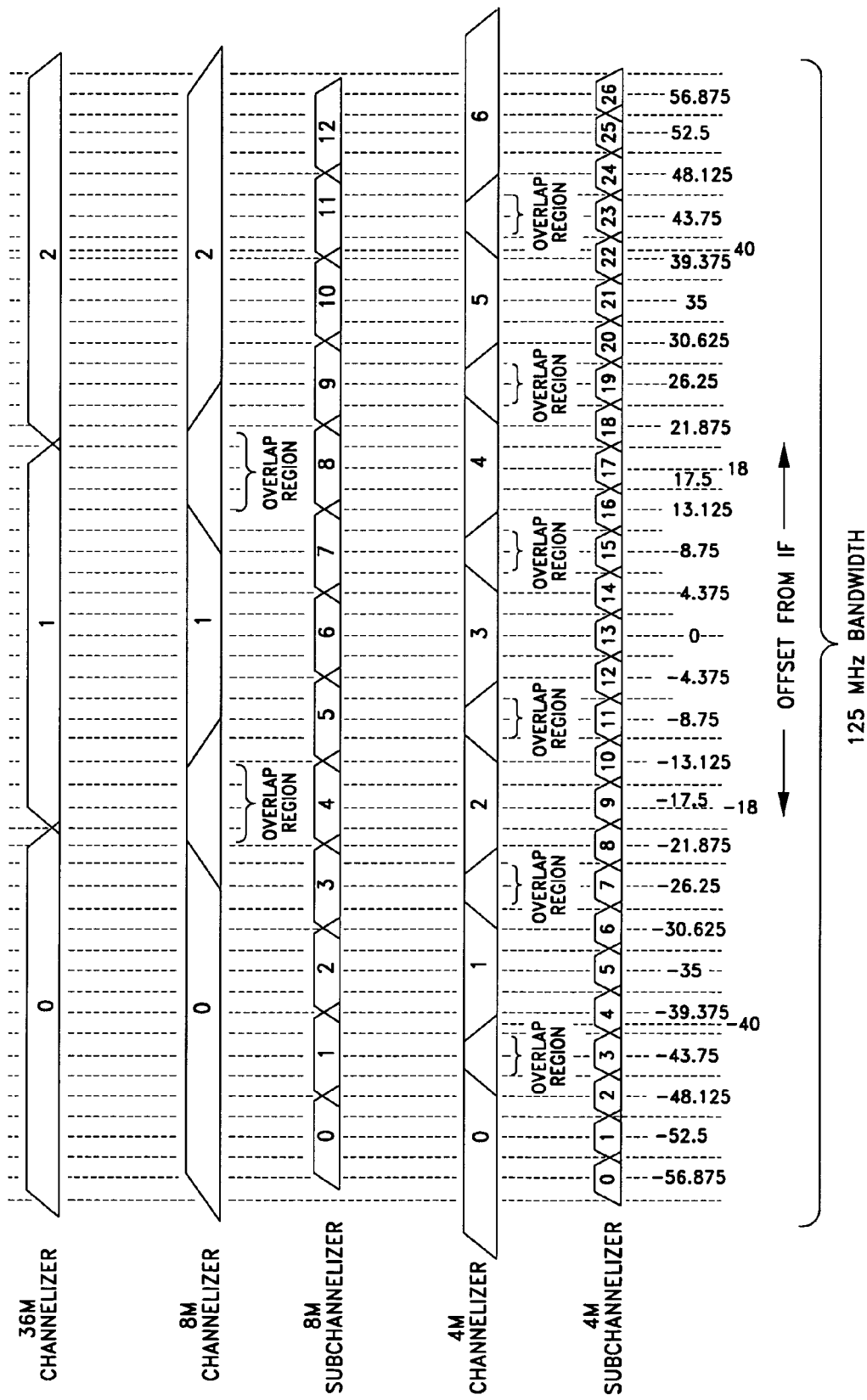
FIG. 7 is a diagram depicting the distribution of channels and subchannels in three bandplans according to one embodiment of the invention.

Using non-critically sampled filter banks allows the filter bands of adjacent channels to be overlapped. When using a cascaded filter arrangement, the ability to overlap filter bands plays an important role in keeping the subchannels evenly spaced around baseband. FIG. 7 is a diagram depicting the arrangement of channels and subchannels for 4 MHz, 8 MHz and 36 MHz bandplans. As represented in FIG. 7, the filter bands for the channels in the 4 MHz and the 8 MHz bandplans are overlapped. The overlap region has the same bandwidth as one subchannel in the corresponding bandplan and contains data for one subchannel. The subchannel located within the overlap region is used to ensure that subchannels remain evenly spaced around baseband. Without such an overlap region, gaps in the spacing of the subchannels occur at points in the spectrum between channels.

Similar to channelizer 13 represented in FIG. 5, the subchannels are output on the IDFT taps. For each of the 7 channels generated by channelizer 13, three or four subchannels generated by subchannelizer 14 are retained. Subchannels located within the transition bands and at Fs/2 are discarded. In addition, one of the pair of duplicate subchannels found in each overlap region in the channels is also discarded. The final 27 subchannels have equal bandwidth and are evenly distributed around baseband, as depicted in FIG. 7.

With respect to the 36 MHz bandplan, the channelizer input sample rate of 140 Msa/sec produces an IDFT length of 3.5 if a 10% guardband is added to the subchannel bandwidth of 36 MHz. This solution is discarded since the IDFT length R is not an integer. When the calculated IDFT length is doubled to 7, band spacing equals 20 MHz. To make this band spacing work within the 36 MHz bandplan, every other channel is discarded and leaving the remaining channels with a 40 MHz spacing. This solution allows the 140 Msa/sec input sample rate to be maintained for each of the 4 MHz, the 8 MHz and the 36 MHz bandplans. Unlike the 4 MHz and the 8 MHz bandplans, however, the 36 MHz band plan uses only a single stage of channelization and therefore does not use subchannelizers in the DCU. Removing the subchannelizer from the system frees up hardware and processing capacity for use in implementing the 36 MHz band plan. One of ordinary skill in the art would understand how to implement a filter for the channelizer within the 36 MHz bandplan based on the description contained herein. Therefore, a block diagram of such a filter has not been included.

Returning to FIG. 1, subchannelizer 14a provides the subchannels to routing module 15. Additionally, the subchannels generated from the input signals received at input ports 1, 2 and 3 are also provided to routing module 15. Using a routing table or some other algorithm, routing module 15 rearranges the order of the subchannels. Specifically, using the group of 27 subchannels generated from each of the input ports under the 4 MHz bandplan, routing module 15 generates a newly arranged group of 27 subchannels designated for each of the output ports. Accordingly, each of the subchannels received via input port 0 can be transmitted via any of output ports 0 to 3 either together or separate from the other subchannels received via input port 0.

Routing module 15 may also be configured to generate test tones within DCU 10 to test routing and reconstruction operations of the DCU as well as to confirm power measurements within the system. The test tones are commandable and are generated to be in the center of each subchannel. Accordingly, each subchannel can either be replaced by a test tone or left in normal operating mode to pass data. To generate the test tone, routing module 15 sets the real component of the subchannel signal to a constant and the complex component of the signal to zero.

Figure 8:
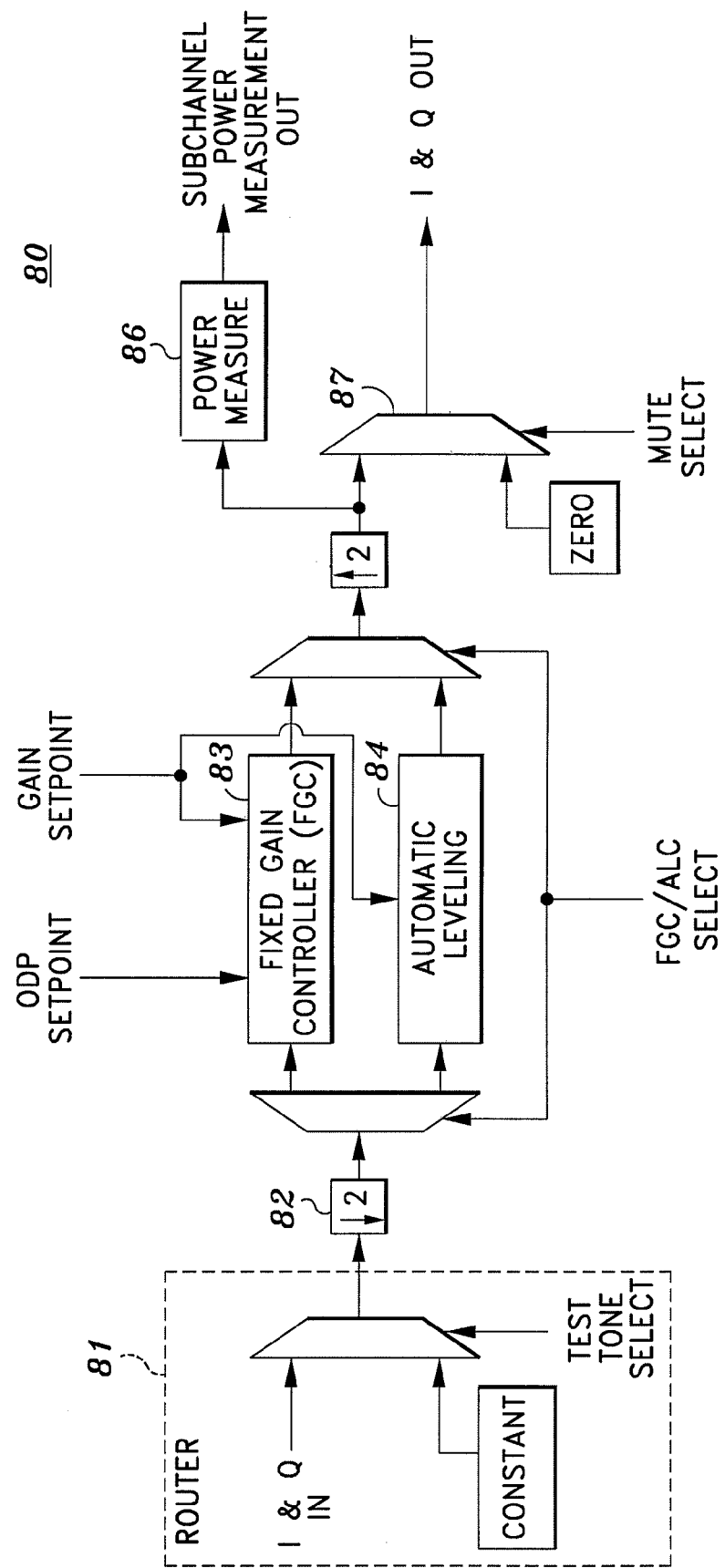
FIG. 8 is a block diagram depicting DSP components of gain control module according to one embodiment of the invention.

While not depicted in FIG. 1, DCU 10 is optionally configured to control the gain of the subchannels routed through routing module 15. Gain control is accomplished by feeding each routed subchannel through a gain controller such as the one depicted in FIG. 8. Gain controller 80 depicted in FIG. 8 receives a subchannel signal from an output 81 of routing module 15. FIG. 8 includes one possible configuration for enabling the test tone generation discussed above. The subchannel data is optionally decimated by 2 using decimator 82 prior to entering the main portion of gain controller 80. This decimation is an optional feature used to reduce the data rate of the gain controller so that it will meet timing in the place and route tools used for FPGA implementations of the DCU.

Using a select signal, subchannel data is routed either to fixed gain controller ("FGC") 83 or automatic leveling controller ("ALC") 84. One set of hardware multipliers is used to scale the subchannel regardless of whether the subchannel is routed to FGC 83 or ALC 84. The multiplicands supplied to the multipliers can be sourced from either the FGC or the ALC. The gain set point and the ODP set point used in the FGC and ALC are set by a user and are stored and updated within DCU 10 using any of a number of known techniques.

Figure 9:
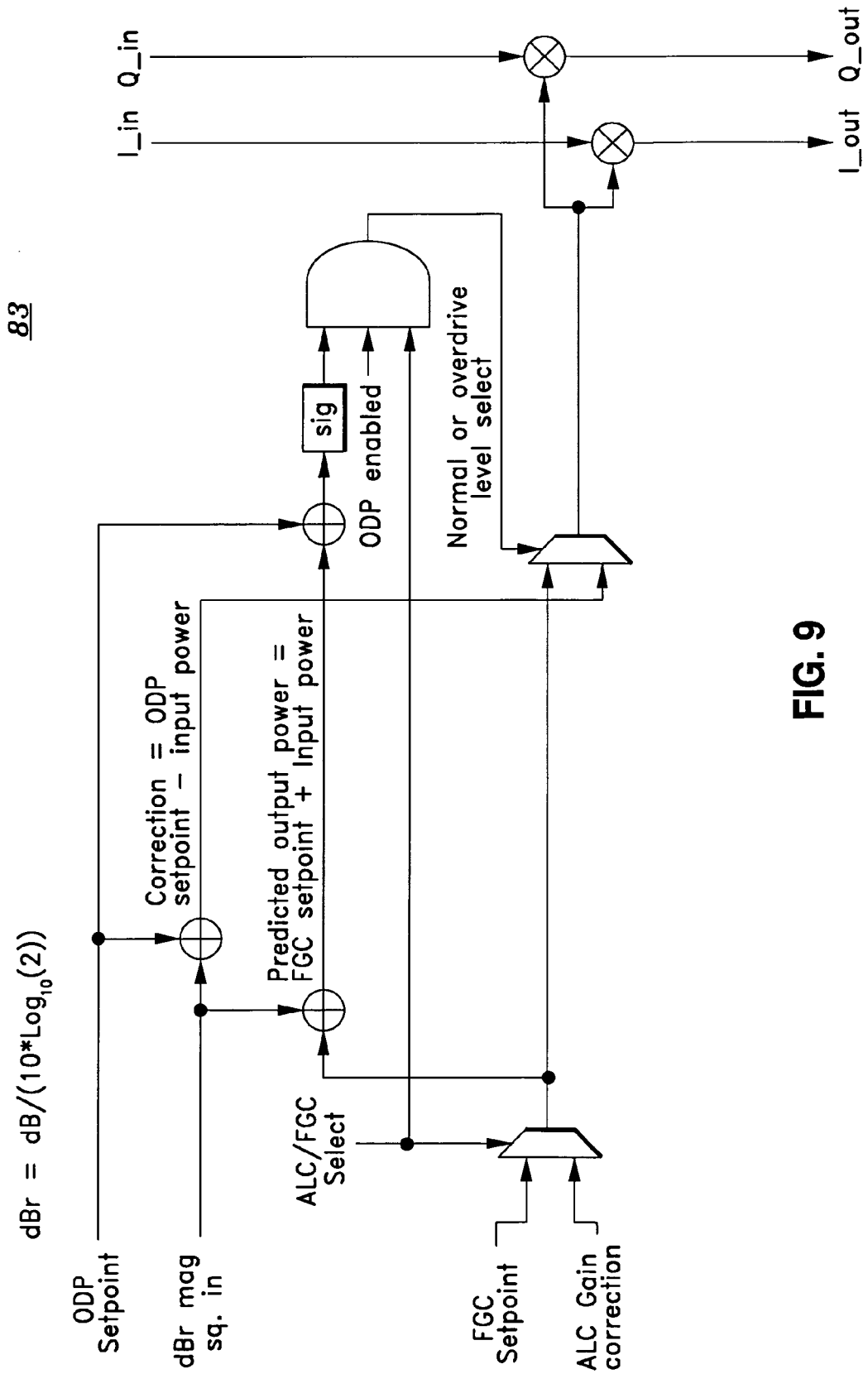
FIG. 9 is a block diagram depicting DSP components of a fixed gain control module according to one embodiment of the invention.

FIG. 9 is a block diagram of FGC 83 according to one embodiment of the invention. FGC 83 applies a user selectable fixed gain (FGC Setpoint) to the input signal, thereby scaling the signal. The range of scaling is +/−12 dB, in 0.5 dB steps. In addition, Overdrive Protection (ODP) may be enabled in the FGC so that an absolute excursion of the signal beyond an overdrive level will result in clipping of the signal. More specifically, subchannel data is passed into a network that predicts what the output power will be and compares it against the ODP Setpoint level. If the ODP is enabled and the signal exceeds the ODP threshold, a new gain is calculated and applied to the signal. In this manner, the signal is limited to the ODP threshold.

A channel mute is implemented downstream from the gain control system so subchannels may be set up either to enable the system or to prevent specified users from gaining access to certain channels.

Figure 10:
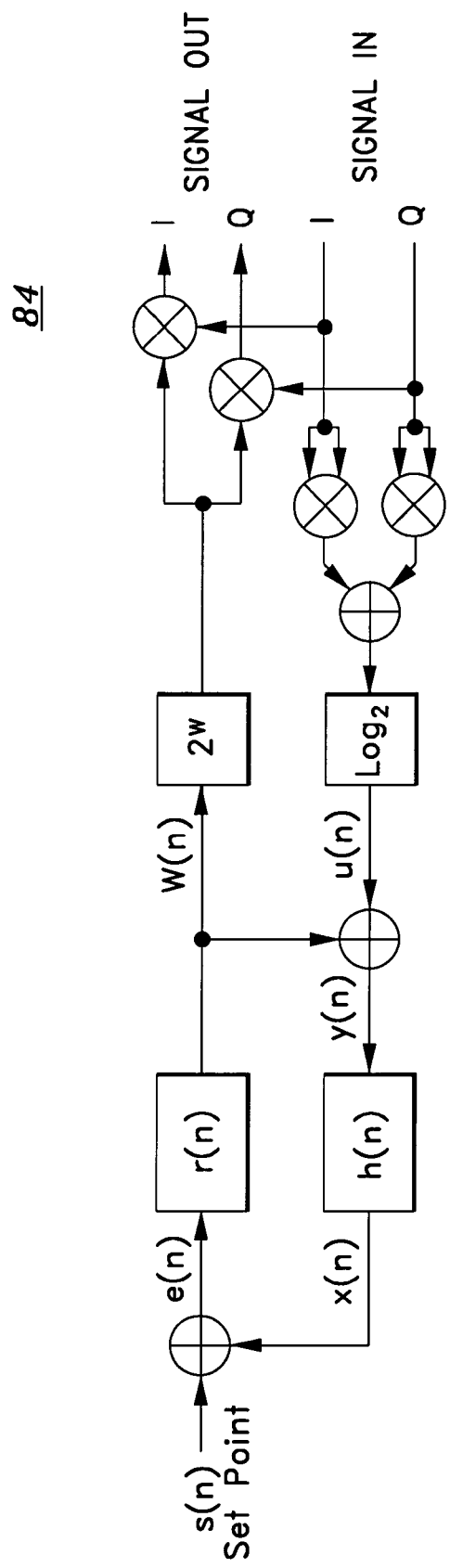
FIG. 10 is a block diagram depicting DSP components of an automatic leveling control module according to one embodiment of the invention.

The Automatic Leveling Controller 84 seeks to maintain each subchannel's power level at a user-defined set point (the gain setpoint). FIG. 10 is a block diagram depicting the DSP components of an Automatic Leveling Controller 84 according to one embodiment of the invention. In operation, the Automatic Leveling Controller (ALC) 84 first finds the instantaneous power of an input signal as the sum of the squares of the input signal's inphase and quadrature legs. This signal is then mapped to log-space by taking the base-2 logarithm. The other input to the system is the user set point, s(n), which is typically uploaded to the system via a telecommand and is set in 0.5 dB steps.

The output of the ALC module 84 is a calculated gain correction, w(n), which is transformed back into linear space via a scaling and exponential function. In certain embodiments of the invention, the exponential function may be implemented using a bit-wise lookup table and a variable shift register. The gain correction is then multiplied by the input signal to get the gain-leveled inphase and quadrature signals out of the system.

Figure 11:
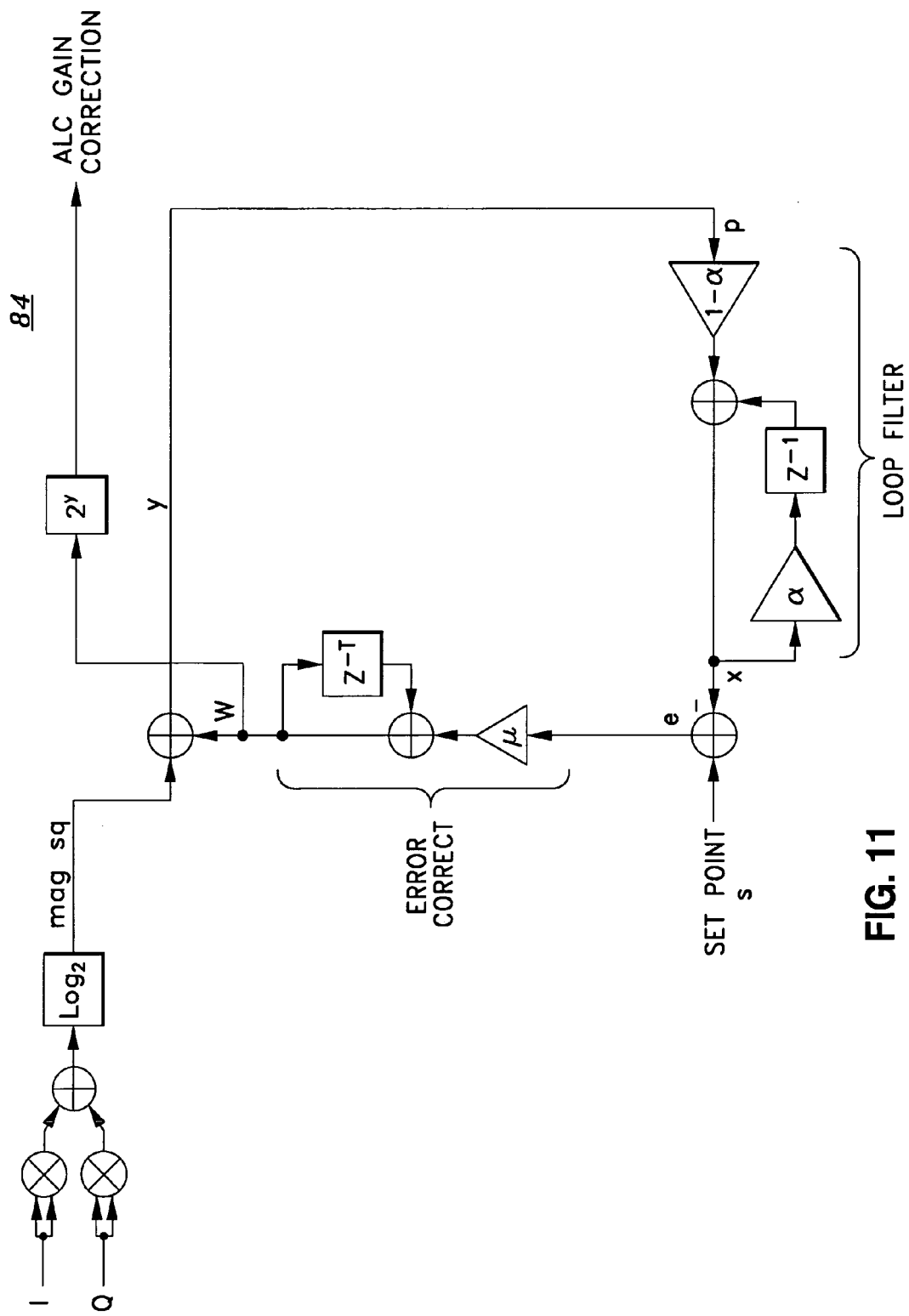
FIG. 11 is a block diagram depicting DSP components of an automatic leveling control module according to one embodiment of the invention.

FIG. 11 is a block diagram depicting the ALC System structure. The loop filter smoothes the sum of the calculated gain correction and the actual signal instantaneous power. Because of the relative signs of the gain correction and the actual signal instantaneous power, the sum is actually representative of a difference. According to one embodiment of the invention, the smoothing filter is implemented as a special type of IIR filter known as a "leaky integrator." This type of filter is an approximation of the integral (and thus the average) of the calculated gain correction. The output of the loop filter, is then subtracted from the set point in order to get an error difference (e) between the desired signal power and the set point. The point of the control loop is to drive e to the set point and thereby loop filter output to zero.

The step size ($\mu$) affects the settling time of the system. A small portion of the error signal is integrated and added to the input signal. Generally, $\mu$ is very small so that a large settling time relative to changes in the instantaneous power in the input signal exists. Otherwise, unwanted amplitude modulation onto the signals in the subchannel would be introduced as the control loop tried to track the modulation on the signals.

The integrated error signal (w(n)) is used as the gain correction because it is the smoothest of the control loop signals. The characteristic equation for the ALC control system is derived as:

$$P(z) = z^2 - \frac{(1+\alpha)}{1+\mu-\alpha\mu^2} + \frac{\alpha}{1+\mu-\alpha\mu} \tag{9}$$

The constant $\mu$ is the step size, and controls the settling time of the control loop. The constant $\alpha$ is the leaky integrator constant, and controls the amount of smoothing that is done to the instantaneous power measurement. For system stability, the roots of P(z) must lie within the unit circle; i.e., |z|<1. In addition, the following inequality must hold true:

$$\mu \leq \frac{1-\alpha}{4\alpha} \tag{10}$$

The constants $\alpha$ and $\mu$ are chosen to comply with equations (9) and (10). Specifically, $\alpha=1-2^{-7}-2^{-9}$, and $\mu=2^{-12}+2^{-14}$. These constants are sums of powers of two, and are therefore easy to implement in hardware. These values yield a settling time of approximately 7 ms.

Returning to FIG. 8, a channel mute 87 is implemented downstream from the gain controller. When selected using a mute select signal, the complex and real values for the subchannel are set to zero. In this manner, access to particular subchannels within the system can be activated and controlled in order to limit access to authorized users.

As represented in FIG. 1, the arranged subchannels designated for output port 0 are supplied to subreconstructor 16*a*. Subreconstructor 16*a* assembles the arranged subchannels into reconstructed channels. In addition, subreconstructor 16*a* corrects the center frequency of each of the subchannels to line up uniformly within the spectrum of the reconstructed channel and interpolates each subchannel so that the subchannels fit into the bandwidth of the reconstructed channel. As with subchannelizer 14*a*, subreconstructor 16*a* is implemented using a non-critically sampled polyphase filter bank. However, subreconstructor 16*a* uses a synthesis filter bank rather than an analysis filter bank.

Figure 12:
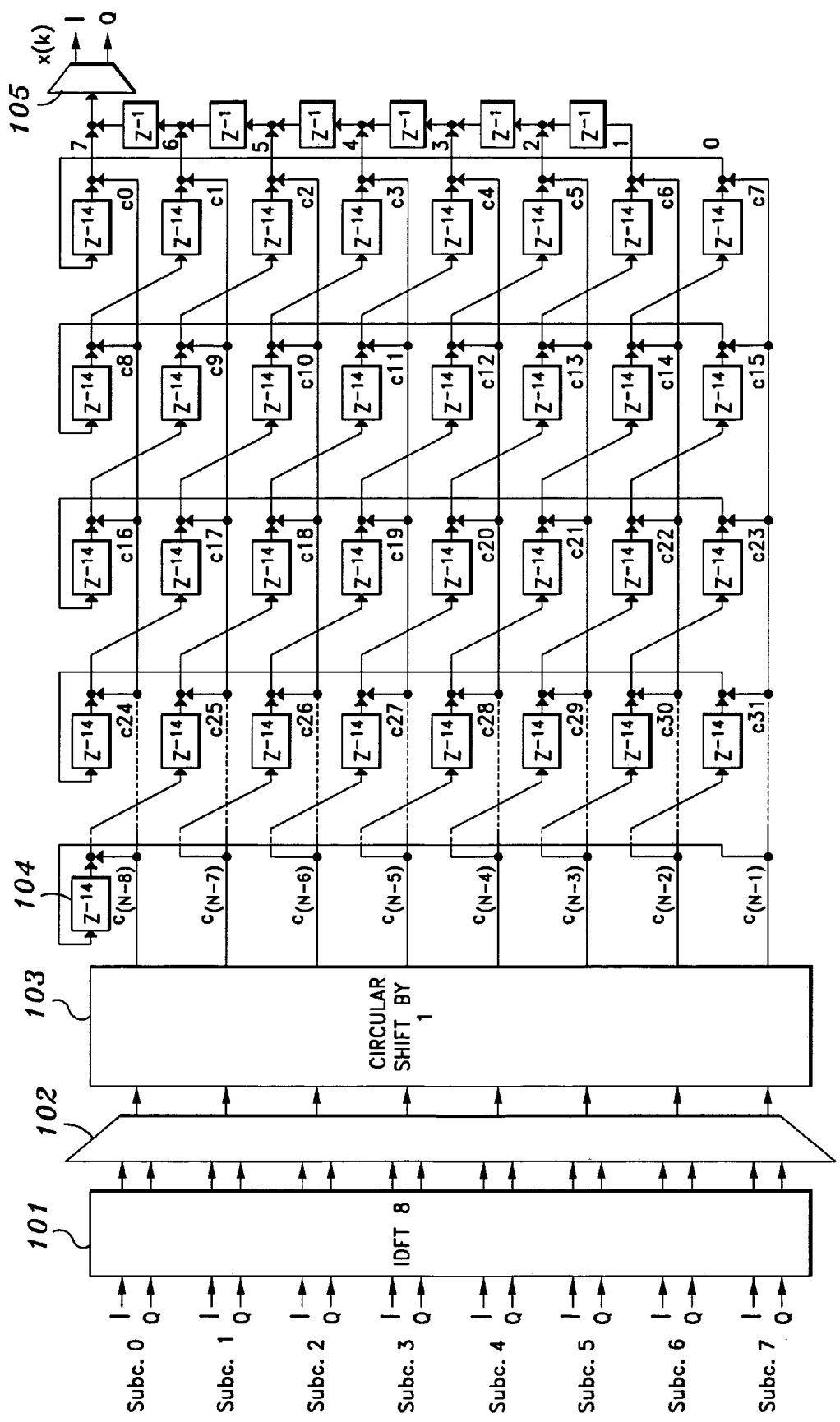
FIG. 12 is a block diagram depicting DSP components of a subreconstructor according to one embodiment of the invention.

FIG. 12 is a block diagram depicting DSP components of subrecontstructor 16 according to one embodiment of the invention. As shown in FIG. 12, subreconstructor 16 includes IDFT element 101, multiplexor 102, circular shift element 103, delay elements 104, and demultiplexor 105. The taps of IDFT 101 receive the subchannels to be combined by subreconstructor 16a. According to one embodiment of the invention, only channels 0, 1, 6 and 7 are used to input subchannels. The other inputs are preferably set to zero. Alternatively, the portions of IDFT 101 corresponding to the unused channels could be removed entirely to preserve hardware resources.

It is noted that subreconstructor 16a performs the reverse operation of subchannelizer 14a. Specifically, the reconstructed channel generated by subreconstructor 16a is a composite of the input subchannels, interpolated P times with Fs/R spaced center frequencies. Subreconstructor 16a may be implemented as either the transposed form of the filter used for subchannelizer 14a or the direct form of that filter, so long as the reverse operation is performed.

Figure 13:
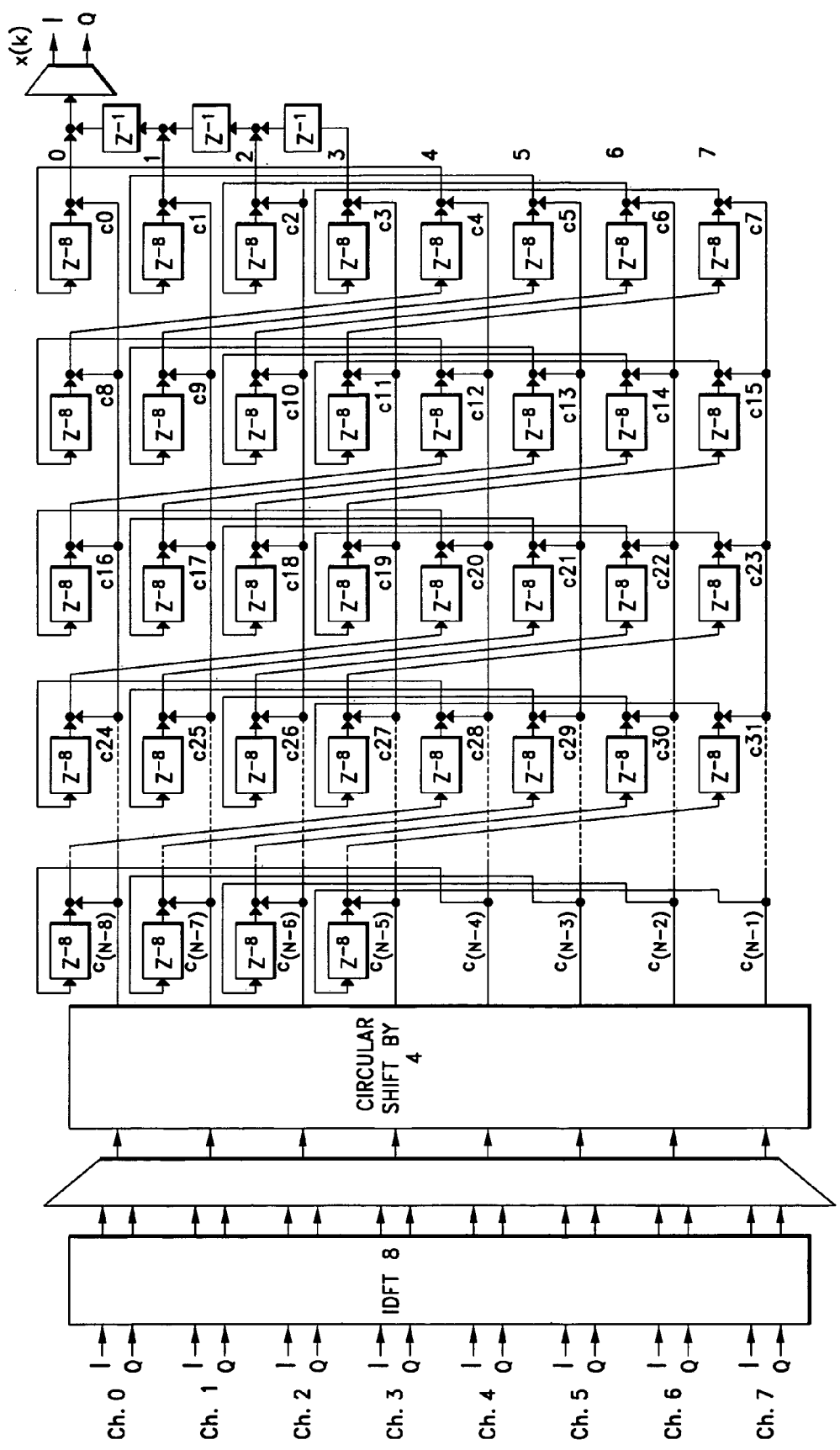
FIG. 13 is a block diagram depicting DSP components of a reconstructor according to one embodiment of the invention.

For reasons similar to those set forth above with respect to channelizer 13a and subchannelizer 14a, the 4 MHz and 8 MHz bandplans utilize a cascaded filter structure to reassemble the subchannels into a complex baseband output signal. As with the channelization portion of DCU 10, the 36 MHz bandplan only uses a single filter bank. Under the 4 MHz and 8 MHz bandplans, the reconstructed channels designated for output port 0 are provided to reconstructor 17a. According to one embodiment of the invention, reconstructor 17a is implemented as a non-critically sampled polyphase synthesis filter bank. Similar to subreconstructor 16a, reconstructor 17a performs the reverse operation of channelizer 13a and may be implemented as in either transposed form or direct form. Specifically, the reconstructed channels generated by subreconstructor 16a are assembled into a complex based band output signal in the same manner as the subchannels were assembled into the reconstructed channels. As with channelizer 13a, the filter bandwidths are overlapped so as to facilitate even spacing among the subchannels being assembled into the reconstructed channels. FIG. 13 is a block diagram depicting DSP components of reconstructor 17 according to one embodiment of the invention.

The parameters for the filter banks used to implement subreconstructor 16a and reconstructor 17a such as interpolation rate, IDFT length, sampling rate are determined so as to reverse operation of the corresponding channelizer 13a and subchannelizer 14a. These values are based on a set of equations generated from equations (1) to (3) provided above in a manner similar to that used to generate equations (4) to (7). The equations are as follows:

$$S_1 = \frac{Fs_1}{R_1} \quad (11)$$

$$Fs_2 = Fs_3 P_2 \quad (12)$$

$$S_2 = \frac{Fs_2}{R_2} = \frac{Fs_3 P_2}{R_2} \quad (13)$$

$$Fs_1 = Fs_2 P_1 = Fs_3 P_1 P_2 \quad (14)$$

In addition, the filter band edges of both subreconstructor 16a and reconstructor 17a are selected so that any imaging due to the interpolation will be attenuated by the filter stopband rejection.

Using the description herein, one of ordinary skill in the art would understand how to implement filters for the subreconstructors and reconstructors according to various bandplans. Accordingly, additional examples of these filters have not been included herein.

Once the reconstructed channels are assembled into a complex baseband output signal designated for output port 0, the signal is provided to postprocessor 18a for final processing prior to be converted to an analog signal by DAC 19a. Postprocessor 18a upsamples the complex baseband output signal and converts it to an output signal at a designated IF using a LO set at ¼ the final sample rate. As with preprocessor 12a, setting the LO at ¼ the output sample rate simplifies the hardware implementation of the filter because all of the oscillator values are in the set [1, i, −1, −i]. Using an output sample rate of 840 Msa/sec, the IF equals 210 MHz. Because only the real part of the complex frequency shift operation is presented to DAC 19a, the imaginary portion of the complex result is not calculated.

Figure 14:
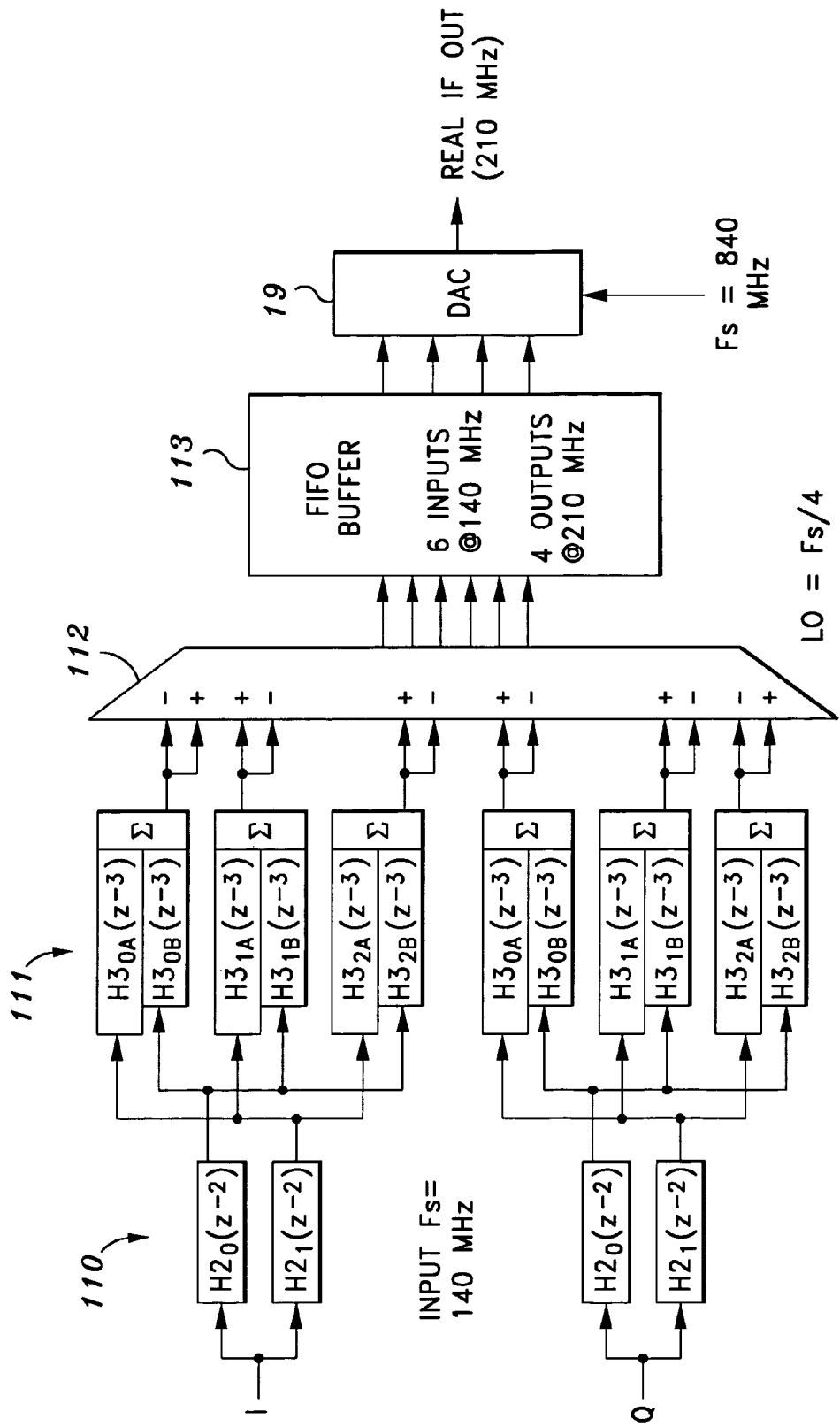
FIG. 14 is a block diagram depicting DSP components of a postprocessor according to one embodiment of the invention.

FIG. 14 is a block diagram depicting DSP components of postprocessor 18 according to one embodiment of the invention. As depicted in FIG. 14, postprocessor 18 includes upsample by two polyphase filters 110, upsample by three polyphase filters 111, multiplexor 112 and FIFO buffer 113. In order to reduce the length of the filter required to perform the upsample from 140 Msa/sec to 840 Msa/sec, the upsample by two polyphase filters 110 are cascaded with the upsample by three polyphase filters. This reduces the number of filter taps required by increasing the relative transition bandwidths of the filters.

In this particular embodiment, the upsample by two polyphase filters 110 are half-band filters having a center frequency of ¼ the output sample rate and an evenly centered transition band. Such a half-band filter has nearly one half the coefficients equaling zero. Similarly, the upsample by three filters are third-band filters where nearly every third filter coefficient is zero and the transition band is centered at ⅙ the output sample rate and evenly spaced between Fs/12 and Fs/4.

The upsample by three filters 111 receive upsampled complex signals from the upsample by two filters 110. In the embodiment depicted in FIG. 14, the upsample by three filters 111 are divided into complimentary halves each operating at ½ the rate output by the upsample by two filters 110. The outputs of the complementary halves are summed to produce the composite filter branch input. The upsample by three filters are divided in this manner to allow the hardware implementing the filters to operate at the lower rate. It is noted, however, that the invention could be implemented without splitting the upsample by three filters 111 using hardware capable of operating at high speeds.

Multiplexor 112 is used to perform a complex frequency shift to ¼ of the final sample rate. Because the LO of Fs/4 samples are restricted to the set [1, i, −1, −i], the complex frequency shift is accomplished by selectively ordering and inverting the real and imaginary data samples produced by upsample by three filters 111. The imaginary portion is not produced. In this manner, frequency shift is accomplished without performing any multiplication. The output of multiplexor 112 is provide to FIFO buffer 113 at a rate of 6×140 Msa/sec. FIFO buffer 113 subsequently buffers the data samples in order to provide the data to DAC 19a at a rate of 4×210 Msa/sec. DAC 19a then converts the digitized output signal to an analog signal for output via output port 0.

Figure 15:
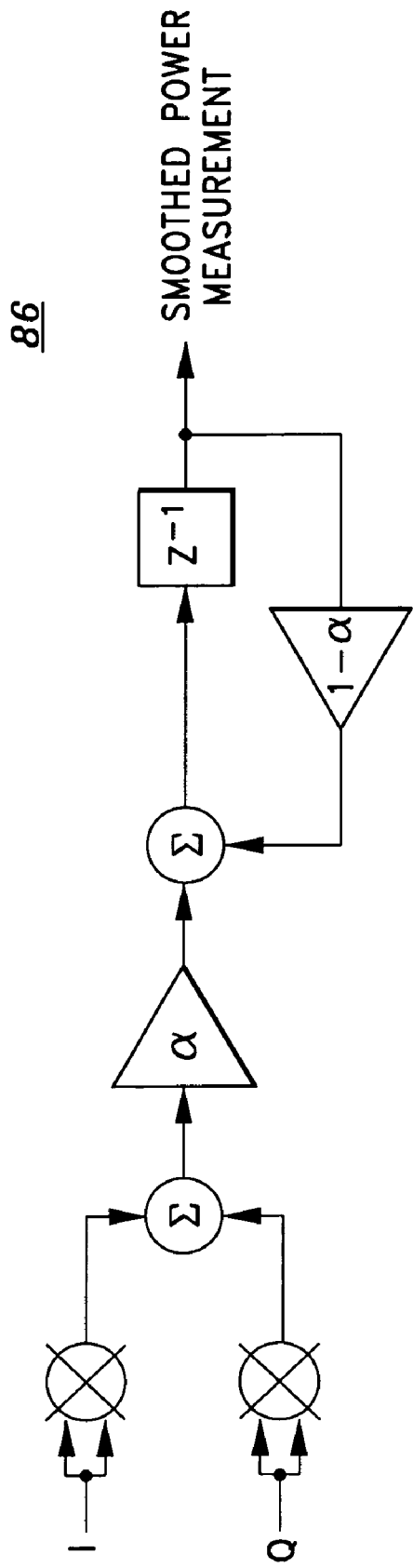
FIG. 15 is a block diagram depicting DSP components of a power smoothing and sampling module according to one embodiment of the invention.

Referring back to FIG. 1, signal power at various stages of DCU 10 is smoothed and stored periodically. These stages include, but are not limited to, the output of preprocessor 12a, the output of the gain control system, and the output of reconstructor 17a. The power is measured using the DSP system depicted in FIG. 15. This system represents the power measurement system 86 depicted in FIG. 8, as well as power measurements systems used to record power at the various points with the DCU mentioned above. The output of this system is periodically stored in power measurement registers that may be included in a telemetry data stream of a satellite using the DCU. The constant α is the same as in the automatic leveling module and equals $2^{-5}$.

The power measurements are Base 2 logarithmic representations (dBr=10*$Log_{10}$2). Subchannel power measurement is made over the entire bandwidth of the subchannel. Similarly, power measurement at the output of the preprocessor represents the input power to the ADC over the 125 MHz input bandwidth. This is based on the assumption that there is an input anti-aliasing filter that is equivalent in bandwidth to the preprocessor filter and therefore removes any energy that exists outside of the 125 MHz input bandwidth. This measurement may be used to set a beam control attenuator that precedes the ADC in order to avoid over-ranging the ADC. The power measurement at the input to the postprocessor is done for similar reasons as that of the input power measurement. This output power measurement provides an indication of the overall power output so as to set the DAC operating point correctly for maximum SNR and dynamic range as well as to avoid over-ranging.

The foregoing description has focused on the processing of an input signal received via input port 0 and an output signal transmitted via output port 0. One of ordinary skill in the art will recognize that the processing of the input signals received via input ports 1, 2 and 3 and the output signals transmitted via output ports 1, 2 and 3 is performed in the same manner using the components of DCU 10 corresponding to the respective ports.

The complex baseband input and output signals are processed in the channelizers, subchannelizers, subreconstructors and reconstructors by time multiplexing (interleaving) the inphase and quadrature components together. Similarly, each subchannelizer processes all of the channels generated by its associated channelizer using time multiplexing. In a similar manner, the subreconstructors and reconstructors reconstruct the complex output signals using time multiplexing.

Figure 16:
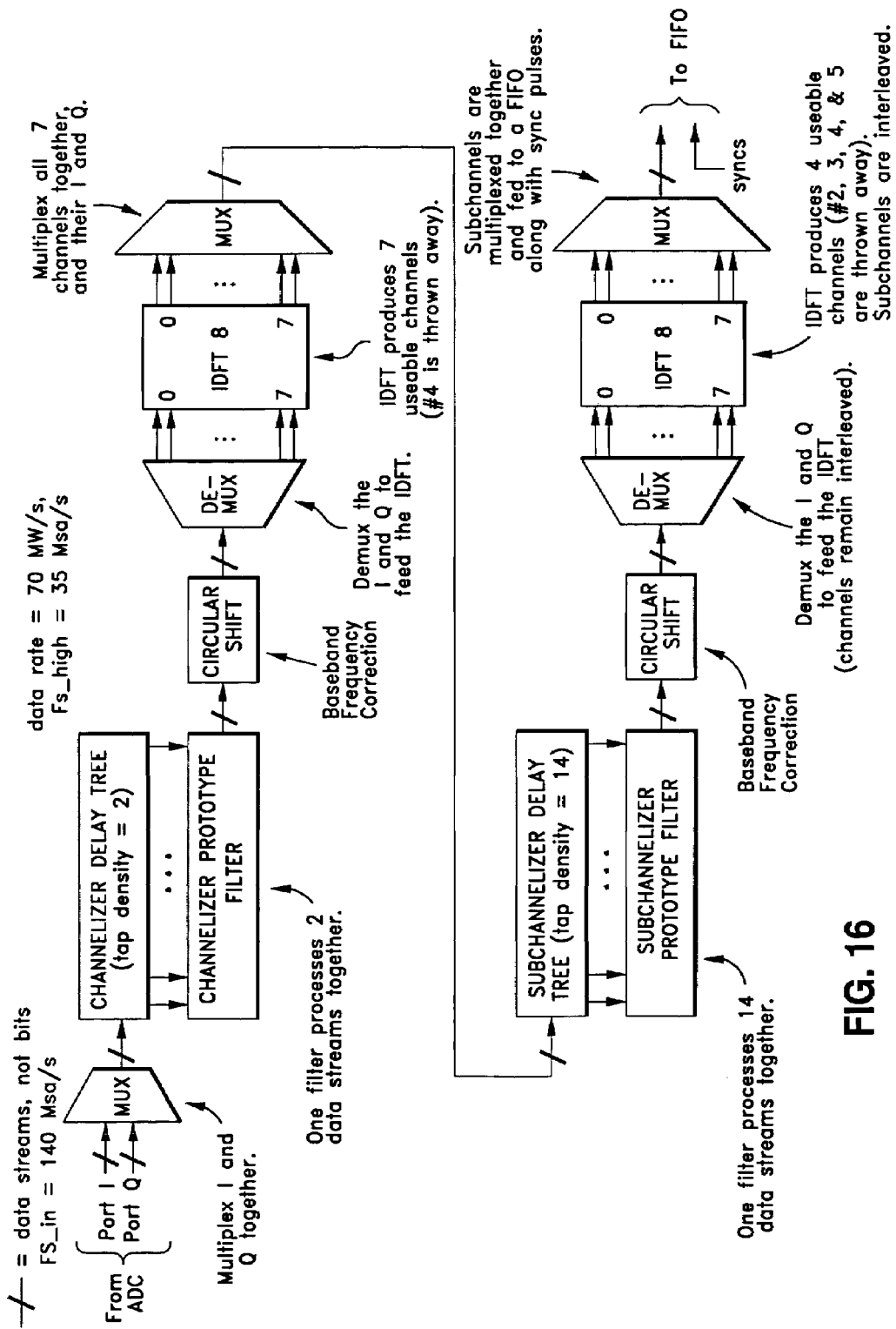
FIG. 16 is a dataflow diagram depicting the flow of data through the DCU according to one embodiment of the invention.

FIG. 16 is a diagram depicting the data flow for channelizing the input signal under the 4 MHz bandplan. With reference to FIG. 16, the channelizer receives the complex signal components I (inphase) and Q (quadrature) from the preprocessor at a sample rate of 140 Msa/sec. Under the 4 MHz bandplan, the channelizer decimates the input signal by a factor of four and therefore would normally run at ¼ the input sample rate (35 Msa/sec). In order to use a single filter for the channelizer, the I and Q components are interleaved and the number of delay elements in the channelizer delay tree is doubled. The channelizer is then run at twice its intended rate (70 Msa/sec) to process the interleaved elements. Because the channelizer uses a complex IDFT, the complex elements are deinterleaved prior to the IDFT element, which cuts the data rate in half to 35 Msa/sec.

Similar to the channelizer, the subchannelizer receives data in complex form from the channelizer. In order to avoid implementing a separate subchannelizer for each retained channel generated by the subchannelizer, all of the retained channels from the channelizer are time multiplexed (interleaved). Under the 4 MHz bandplan, seven channels are retained and supplied to the subchannelizer and the subchannelizer would normally decimate by a factor of 7 and run at a rate of 5 MHz. To maintain the processing of all seven channels and their respective complex components I and Q, the subchannelizer is run at a data rate 7×2×5 Msa/sec (70 Msa/sec). As with the channelizer, a complex IDFT is employed and that requires demultiplexing of the I and Q components. However, the filtered channel data can remain multiplexed and the data rate with respect to the IDFT reduced to 35 Msa/sec. The retained subchannels are then time multiplexed for further processing.

The foregoing description provides an example of how time multiplexing can be utilized to minimize hardware requirements in processes that include data rate decimation. A similar process is involved for using time multiplexing with respect to the subreconstructors and reconstructors. The use of multiplexing to minimize hardware requirements is an optional feature of the invention. Alternative embodiments of the invention may implement individual channelizers and subchannelizers for each signal.

The arrangement and number of respective components depicted in FIG. 1 is intended to represent only one embodiment of the invention. As previously mentioned, different numbers of input/output ports may be processed by a DCU according the invention. Furthermore, different number of channelizers, subchannelizers, subreconstructors and reconstructors relative to the number of ports and preprocessors/postprocessors may be used in alternative embodiments of the invention.

The components of DCU 10 depicted in FIG. 1 may be implemented using various hardware solutions. Preferably, the preprocessors, postprocessors, channelizers, subchannelizers, subreconstructors and reconstructors are implements using programmable gate arrays. Using gate arrays such as FPGAs allows the DCU to be reconfigured according to different bandplans by loading a different configuration file. In this manner, multiple bandplan configurations can be made available using a single set of hardware having different configuration files for each bandplan.

The previous description is provided to enable any person skilled in the art to practice the various embodiments described herein. Various modifications to these embodiments will be readily apparent to those skilled in the art, and generic principles defined herein may be applied to other embodiments. Thus, the claims are not intended to be limited to the embodiments shown and described herein, but are to be accorded the full scope consistent with the language of the claims, wherein reference to an element in the singular is not intended to mean "one and only one" unless specifically stated, but rather "one or more". All structural and functional equivalents to the elements of the various embodiments described throughout this disclosure that are known or later come to be known to those of ordinary skill in the art are expressly incorporated herein by reference and intended to be encompassed by the claims. Moreover, nothing disclosed herein is intended to be dedicated to the public regardless of whether such disclosure is explicitly recited in the claims.

What is claimed is:

1. A digital channelizer unit, comprising:
a plurality of preprocessors configured to reduce a sample rate of respective ones of a plurality of digital input signals and downconvert the digital input signals to complex baseband input signals;
a plurality of channelizers configured to divide respective ones of the complex baseband input signals into a plurality of channels and reducing the respective sample rates of the plurality of channels;
a routing module configured to rearrange the plurality of channels according to a routing table;
a plurality of reconstructors configured to increase the sample rate of each of the rearranged plurality of channels and combine the rearranged plurality of channels into a plurality of complex baseband output signals; and
a plurality of postprocessors configured to increase the sample rates of respective ones of the plurality of complex baseband output signals and upconvert the complex baseband output signals to digital passband output signals.

2. The digital channelizer unit according to claim 1, wherein each of said plurality of preprocessors comprises a decimating polyphase filter.

3. The digital channelizer unit according to claim 1, wherein each of said plurality of channelizers comprises a non-critically sampled polyphase analysis filter bank.

4. The digital channelizer unit according to claim 1, wherein each of said plurality of channelizers comprises a plurality of cascaded non-critically sampled polyphase analysis filter banks.

5. The digital channelizer unit according to claim 1, wherein each of said plurality of reconstructors comprises a non-critically sampled polyphase synthesis filter bank.

6. The digital channelizer unit according to claim 1, wherein each of said plurality of reconstructors comprises a plurality of cascaded non-critically sampled polyphase synthesis filter banks.

7. The digital channelizer unit according to claim 1, wherein each of said postprocessors comprises:
a plurality of cascaded polyphase interpolation filters; and
a multiplexer.

8. The digital channelizer unit according to claim 1, wherein said plurality of channelizers and said plurality of reconstructors comprise a plurality of programmable gate arrays, wherein said plurality of programmable gate arrays are configurable for a plurality of band plans.

9. The digital channelizer according to claim 1, wherein said plurality of preprocessors and said plurality of postprocessors comprises a plurality of programmable gate arrays.

10. The digital channelizer unit according to claim 1, further comprising:
a plurality of analog-to-digital converters for converting respective ones of a plurality of analog input signals into the digital input signals; and
a plurality of digital-to-analog converters for converting respective ones of the digital passband output signals to analog output signals.

11. A digital channelization method for channelizing and rearranging a plurality of digital input signals, the method comprising the steps of:
reducing a sample rate of respective ones of a plurality of digital input signals;
downconverting the plurality of digital input signals to complex baseband input signals;
dividing each of the complex baseband input signals into a plurality of channels;
reducing a sample rate of each of the plurality of channels;
rearranging the plurality of channels;
increasing the sample rate of each of the rearranged plurality of channels;
combining the rearranged plurality of channels into a plurality of complex baseband output signals;
increasing the sample rate of each of the plurality of complex baseband output signals; and
upconverting the plurality of complex baseband output signals to digital passband output signals.

12. The method according to claim 11, further comprising alias filtering the complex baseband input signals.

13. The method according to claim 11, further comprising correcting a frequency of each shifted channel to baseband.

14. The method according to claim 11, wherein said dividing step comprises:
decimating a sample rate of the complex baseband input signals by a first amount;
dividing each of the complex baseband input signals into a plurality of channels;
decimating a sample rate of the plurality of channels by a second amount; and
dividing each of the plurality of channels into a plurality of subchannels,
wherein the plurality of subchannels are rearranged in said rearranging step, and
wherein said combining step comprises:
interpolating a sample rate of the rearranged plurality of subchannels by a third amount;
combining the rearranged plurality of subchannels into a rearranged plurality of channels;
interpolating a sample rate of the rearranged plurality of channels by a fourth amount; and
combining the rearranged plurality of channels into the plurality of complex baseband output signals.

15. The method according to claim 11, further comprising programming a plurality of programmable gate arrays to perform said dividing and combining steps.

16. The method according to claim 11, further comprising correcting the center frequencies of the plurality of channels to uniformly line up the plurality of channels within the plurality of complex baseband output signals.

17. The method according to claim 11, further comprising shifting the plurality of complex baseband output signals to an intermediate frequency.

* * * * *